United States Patent [19]

Höwing

[11] Patent Number: 5,525,843

[45] Date of Patent: Jun. 11, 1996

[54] SEAT OCCUPANT DETECTION SYSTEM

[75] Inventor: Mats Höwing, Floda, Sweden

[73] Assignee: AB Volvo, Sweden

[21] Appl. No.: 194,671

[22] Filed: Feb. 14, 1994

[51] Int. Cl.[6] .................................................. G01R 27/26
[52] U.S. Cl. .......................... 307/9.1; 307/10.1; 180/271; 280/727; 324/663; 361/278
[58] Field of Search ..................... 307/9.1–10.8; 280/727, 730, 728, 732, 735; 180/271, 272, 273; 296/35.2; 324/663; 361/278, 280

[56] References Cited

U.S. PATENT DOCUMENTS

| | | | |
|---|---|---|---|
| 3,740,567 | 6/1973 | Atkins | 307/10.1 |
| 4,796,013 | 1/1989 | Yasuda et al. | 340/562 |
| 5,074,583 | 12/1991 | Fujita et al. | 280/735 |
| 5,161,820 | 11/1992 | Vollmer | 280/735 |

*Primary Examiner*—William M. Shoop, Jr.
*Assistant Examiner*—Peter Ganjoo
*Attorney, Agent, or Firm*—Samuels, Gauthier, Stevens & Reppert

[57] ABSTRACT

A method and system for detecting the presence of an occupant on a vehicle seat is disclosed. The vehicle seat is provided with at least a pair of electrodes which are connected to a detection circuit for detecting a change in capacitance between the electrodes. If the detection circuit detects a sufficiently large change in capacitance, a positive detection signal is produced. To reduce the risk of interference, the electrodes of the detection circuit are substantially insulated from the chassis of the vehicle and its electrical system when the detection circuit is in an active condition.

15 Claims, 2 Drawing Sheets

SEAT OCCUPANT DETECTION SYSTEM

TECHNICAL FIELD

The present invention relates to a method and a system for detecting the presence of an occupant on a vehicle seat. Such method and system may advantageously, though not exclusively, be used for controlling the deployment of a vehicle airbag such that the airbag actuator is only armed when a seat in the vehicle, for example the front passenger seat, is occupied by an occupant who adopts a normal sitting position.

BACKGROUND OF THE INVENTION

It is becoming increasingly common to equip vehicles with so-called airbag restraints for both the driver and the front seat occupant. Since it can be assumed that the driver's seat of a vehicle is always occupied when the vehicle is in motion, it is generally desirable that the airbag on the driver's side be deployed if the vehicle is subjected to a deceleration above a predetermined threshold. Frequently, though, the driver is alone in the vehicle and, consequently, deployment of the passenger side airbag is unnecessary. Since unnecessary deployment of the passenger side airbag implies increased repair costs to refit the airbag, there is a demand from i.a. insurance companies to provide vehicles equipped with twin airbags with means to disarm the passenger side airbag when the passenger seat is unoccupied.

Clearly, there are many various ways of establishing whether a vehicle seat is occupied. For instance, the vehicle may be provided with a simple on-off switch which is activated manually by the driver or passenger. Such a system is however unfavoured since the driver or passenger may forget to arm the airbag actuator when the seat is occupied. Accordingly, a means of detection which functions without human intervention is sought.

From U.S. Pat. No. 3,863,209 there is known a vehicle seat having a load-dependent switch arranged in the seat cushion. When the seat is occupied by a person of sufficient weight, the switch is activated to arm the airbag sensor. A disadvantage with such a system is that the load-dependent switch cannot distinguish between a human being and a heavy item which may be placed on the seat. Furthermore, it is generally undesirable for an airbag to be deployed if the upper torso and head of the seat occupant are too close to the airbag before it is deployed. The use of a load dependent switch in the seat cushion clearly cannot solve this problem.

It is also known to use optical or ultrasonic transmitters and sensors to detect the presence of a seat occupant, though such systems are relatively difficult to install, requiring components to be mounted at different locations within the vehicle cabin. An example of such a system is disclosed in DE-A-4 023 109.

One method of detection to which much time is being devoted employs a seat electrode which, together with the vehicle body as a counter-electrode, constitutes a capacitor. The capacitor is connected to an oscillating circuit, the frequency of which depends on the capacitance between the electrodes of the capacitor. The capacitance is dependent on the dielectric constant of the material which is present between the electrodes. Thus, when the seat is unoccupied, a low dielectric constant exists, thereby providing low capacitance. This implies that the oscillator circuit oscillates at a relatively high frequency. Conversely, when the seat is occupied by a passenger, a higher dielectric constant is present and consequently the oscillator circuit oscillates at a relatively low frequency. By providing a control circuit which is activated by the presence of a frequency of certain magnitude, an arming signal can be transmitted to the airbag sensor when the seat is occupied. A system of this type is described in DE-A-4 110 702.

Due to the risks involved by deployment of an airbag when the passenger seat is occupied by a rear-facing child seat, it is important that the chosen detection system can distinguish between a child occupying the passenger seat and sitting in a conventional position and a child sitting in a rear-facing child seat mounted on the front passenger seat. A problem which has heretofore existed with known capacitance-dependent systems is that the capacitance between the electrodes is significantly increased if a body with a high dielectric constant comes between the electrodes. This can occur, for example, if the passenger seat is occupied by a child in a child seat and an adult passenger contacts the child or the seat. Such an action causes the frequency in the oscillator circuit to decrease to a level which could well be below the predetermined disarming frequency for the airbag sensor, thereby providing the sensor with false information. Thus, although the passenger seat is occupied by a child seat, it is possible that if the vehicle were to be involved in an accident which would deploy the driver's side airbag, the passenger side airbag could also be deployed.

SUMMARY OF THE INVENTION

It is therefore an object of the invention to provide a method and a system for detecting the presence of an occupant on a vehicle seat, which method and system may be used for controlling the deployment of a vehicle airbag such that the airbag sensor is only armed when the front passenger seat is occupied by an occupant who adopts a normal sitting position, and which method and system overcome the problems associated with hitherto known systems.

This object is achieved in accordance with the present invention by a method for detecting the presence of an occupant on a vehicle seat, said method comprising:

providing said vehicle seat with a first electrode;

providing a detection circuit comprising said first electrode and a second electrode, said first electrode and said second electrode building a capacitor having capacitance, said second electrode being placed with respect to said first electrode so that at least a portion of said occupant influences the capacitance between the electrodes when said occupant occupies said seat;

using said detection circuit to determine the capacitance between said first and second electrodes;

comparing said capacitance with a predetermined value, and substantially insulating said electrodes of said detection circuit from the chassis of the vehicle and its electrical system at least when said detection circuit is in an active condition.

The invention further provides a system for detecting the presence of an occupant on a vehicle seat, said system comprising a vehicle seat provided with a first electrode, an detection circuit comprising said first electrode and a second electrode, said first electrode and said second electrode building a capacitor having capacitance, said second electrode being placed with respect to said first electrode so that at least a portion of said occupant influences the capacitance between the electrodes when said occupant occupies said seat, said detection circuit detecting the capacitance between said first and second electrodes, wherein said electrodes of said detection circuit are substantially insulated from the chassis of the vehicle and its electrical system at least when said detection circuit is in an active condition.

Preferred embodiments of the invention are detailed in the respective dependent claims.

BRIEF DESCRIPTION OF THE DRAWINGS

The invention will be described in greater detail in the following by way of example only and with reference to the attached drawings, in which.

DETAILED DESCRIPTION OF PREFERRED EMBODIMENTS

Figure 1:
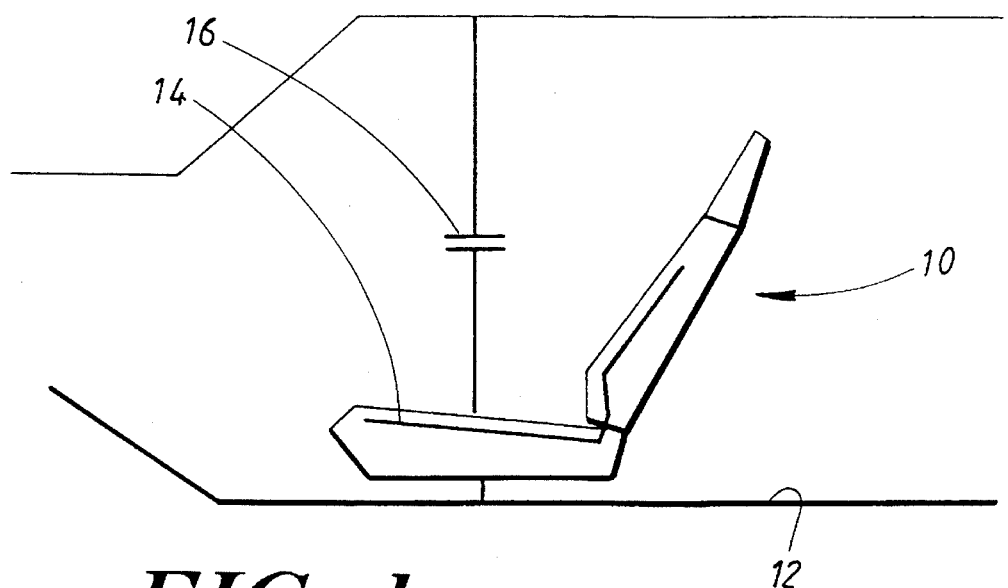
FIG. 1 is a schematic representation of a prior art detection system.

In FIG. 1, reference numeral 10 generally denotes a vehicle seat attached in any usual manner to a vehicle chassis 12. In accordance with one known prior art occupant detection system, the seat is provided with a heating element 14 which forms one electrode of a capacitor, schematically illustrated in the drawing and denoted by reference numeral 16, whilst the second electrode of the capacitor 16 is formed by the vehicle chassis 12 itself.

Figure 2:
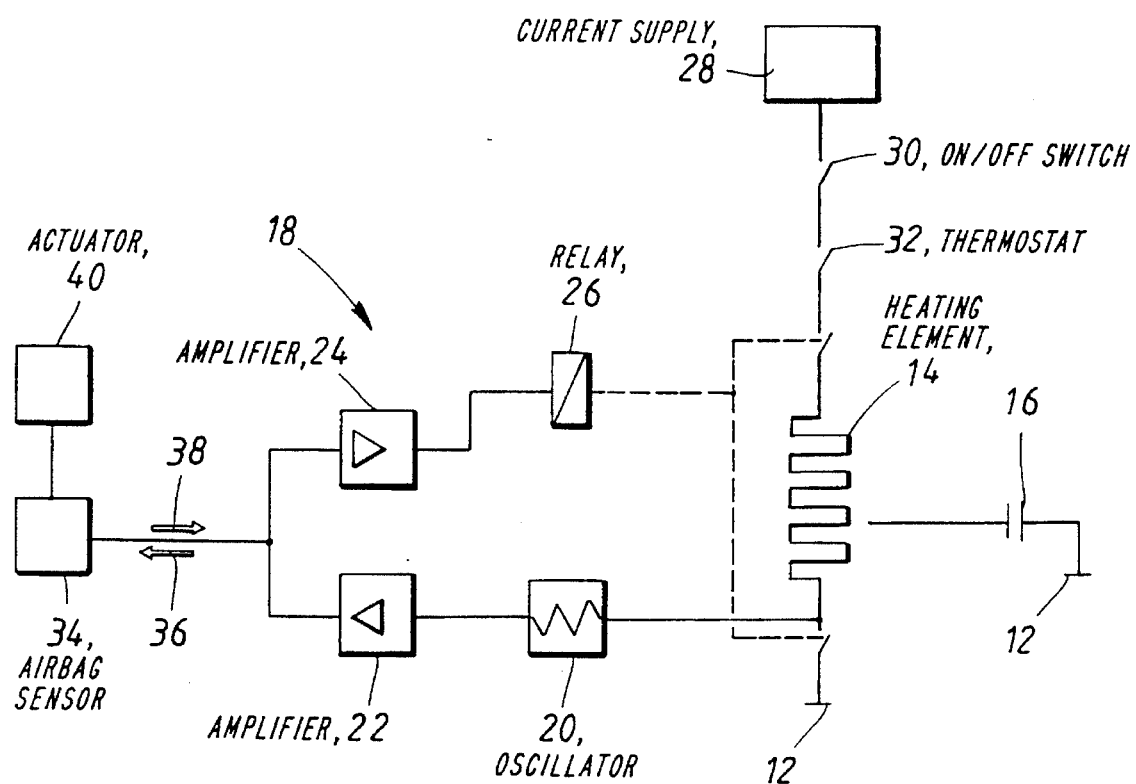
FIG. 2 is a circuit diagram for the prior art system, according to FIG. 1.

A detection circuit which is commonly employed in the known detection system illustrated in FIG. 1 is shown in FIG. 2 and generally denoted by reference numeral 18. Thus, the heating element 14 forms the first electrode of the capacitor 16 whilst the vehicle chassis 12 forms the second electrode. In addition to the afore-mentioned components, the detection circuit 18 further comprises an oscillator 20, amplifiers 22 and 24, a relay 26, a current supply 28 in the form of the vehicle electrical system, an on/off switch 30 for the heating element 14 and a thermostat 32 in the seat. Reference numeral 34 denotes an airbag sensor connected to the detection circuit 18 and which is adapted to receive a circuit output signal 36 when a control input signal 38 is applied to the circuit. The airbag sensor is in turn connected to an actuator 40 of an airbag (not shown).

The prior art detection system functions in the following manner. The capacitance between the electrodes 12 and 14 depends on whether a passenger is occupying the seat 10. So that the capacitance is not affected by the current supplied to the heating element 14, when the control input signal 38 is to be applied to the circuit 18, the current supply 28 to the heating element is automatically switched off. The frequency at which the oscillator vibrates is dependent on the capacitance between the electrodes 12 and 14. When the seat 10 is empty, the oscillator vibrates at a predetermined frequency. Should the seat be occupied by a passenger, the capacitance between the electrodes 12 and 14 increases and the oscillator vibrates at a proportionally lower frequency. By providing the detection circuit 18 with a comparator, for example in the form of software in the airbag sensor, in which a predetermined threshold frequency has been inputted, a signal output 38 to the airbag sensor 34 can be generated if the measured frequency is below said preset threshold frequency. The output signal is used to arm the sensor 34 so that if the sensor thereafter senses e.g. a sufficiently high vehicle retardation, an actuating signal is transmitted to the airbag actuator 40 to thereby deploy the airbag.

As mentioned in the introductory portion of the present description, the capacitance between the electrodes 12 and 14 is substantially the same when a child is sitting in a conventional position on the seat 10 or if the same child is sitting in a rear-facing child seat mounted on the seat 10. Thus, if the detection circuit is provided with a frequency threshold which corresponds to the capacitance created by a person of say 35 kg mass, thereby preventing the deployment of the airbag when a child seat is fitted, the airbag will not deploy if a person less than 35 kg is sitting in a conventional position on the seat 10.

A further problem with the above-described system is that the capacitance of the detection circuit is affected not only by the occupant of the rear facing child seat, but also by any other vehicle occupant who may touch the child or passenger seat. This is because of the proximity of the other vehicle occupant to the second electrode 12, i.e. the vehicle chassis.

Figure 3:
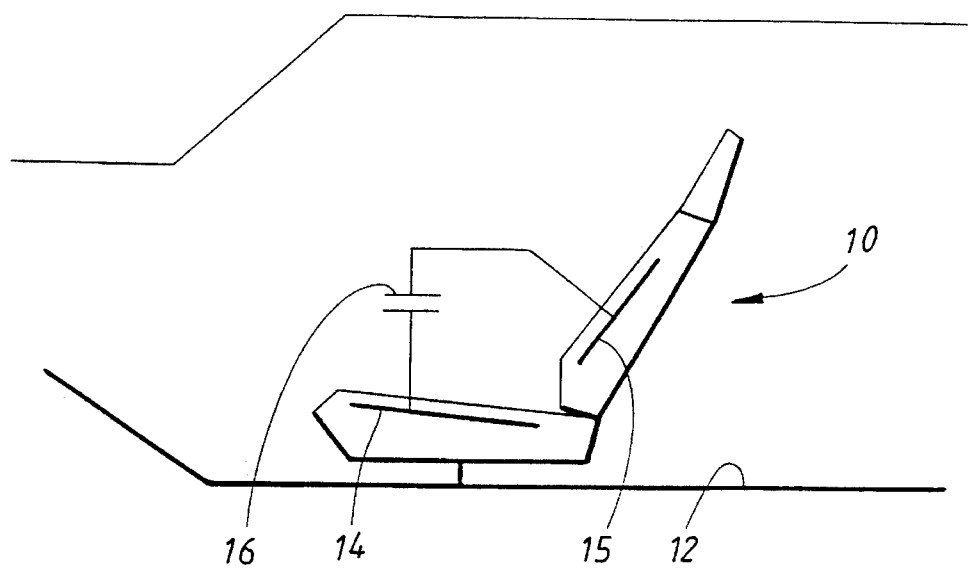
FIG. 3 is a schematic representation of the detection system according to the present invention.
Figure 4:
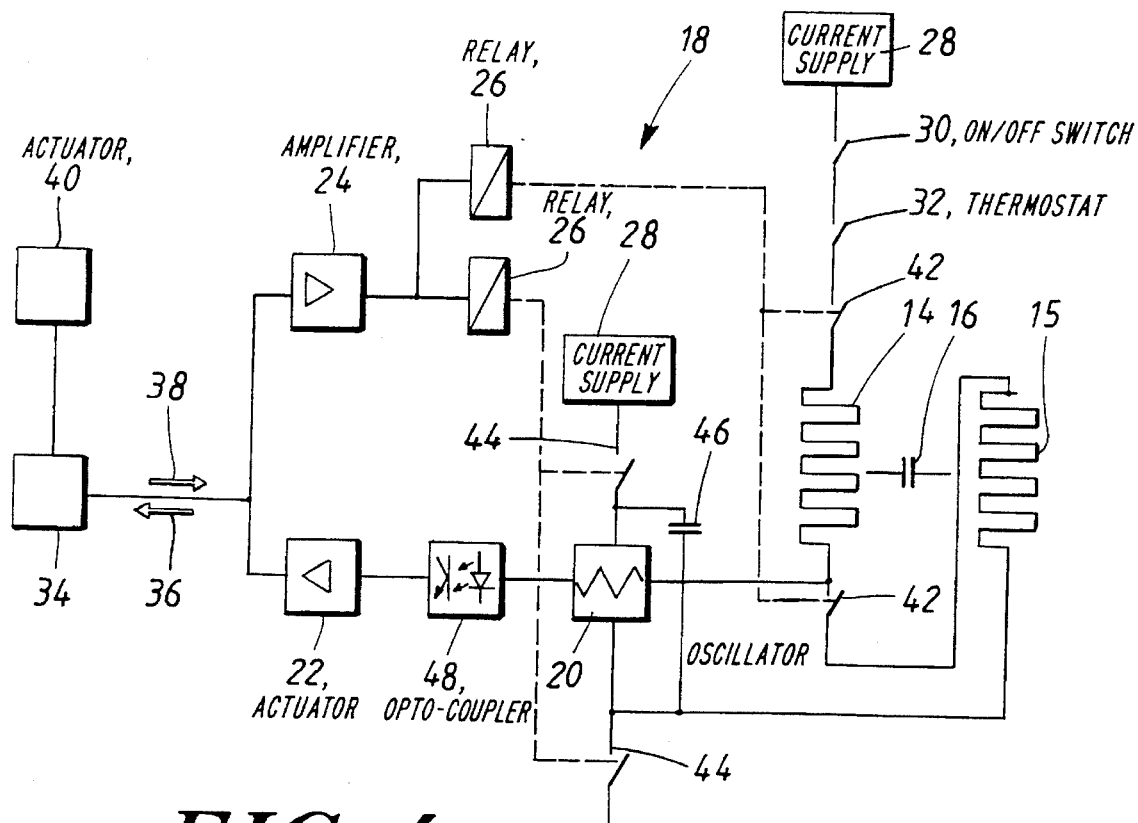
FIG. 4 is a circuit diagram suitable for the detection system according to the present invention.

The above disadvantages are solved in accordance with the present invention by a detection system as illustrated in FIGS. 3 and 4. In the figures like reference numerals are used to denote like parts. Thus, in FIG. 3, reference numeral 10 generally denotes a vehicle seat attached in a conventional manner to the vehicle chassis 12. The seat 10 is provided with a first electrode 14 which may or may not constitute a heating element. In accordance with the invention, the seat 10 is provided with a second electrode 15, the two electrodes 14 and 15 acting as the electrodes of a capacitor 16.

A detection circuit which may be employed in the detection system illustrated in FIG. 3 is shown in FIG. 4 and is generally denoted by reference numeral 18. Thus, reference numeral 14 denotes the first electrode of the capacitor 16 and reference numeral 15 the second electrode. Although drawn as heating elements, it is to be understood that the electrodes need not constitute heating elements. In addition to the afore-mentioned components, the detection circuit 18 may further comprise an oscillator 20, amplifiers 22 and 24, relays 26, a current supply 28 in the form of the vehicle electrical system, and optionally an on/off switch 30 for the heating element and a thermostat 32 in the seat. Reference numeral 34 denotes an airbag sensor connected to the detection circuit 18 and which is adapted to receive a circuit output signal 36 when a control input signal 38 is applied to the circuit. The airbag sensor is in turn connected to an actuator 40 of an airbag (not shown).

In accordance with the invention, to ensure that the detection circuit detects substantially only the presence of an occupant on the seat 10 and is not influenced by external sources, the detection circuit 18 is further provided with a pair of relays 42 and a pair of relays 44. The pair of relays 42 are necessary only where the first and/or second electrodes of the capacitor 16 is a heating element. These relays 42 serve to disconnect the heating element 14 from its current source when it is desired to detect the presence of the occupant.

The detection circuit 18 as illustrated in FIG. 4 is provided with a current supply capacitor 46 which serves to provide the detection circuit with power when the detection circuit is in an active state, i.e. when it is desired to detect the presence of an occupant. To further reduce the chances of the detection circuit 18 being affected by external sources, an opto-coupler 48 may advantageously be included in the circuit to isolate the output signal 36.

The present invention functions on the principle of detecting a change in capacitance between the electrodes 14 and 15, with these electrodes being substantially insulated from the chassis 12 of the vehicle and its electrical system when the detection is taking place. Thus, the use of an oscillator 20 is purely optional and serves merely as a useful means for obtaining a measurable signal (in this case a frequency) which corresponds to the change in capacitance. The expression "substantially insulated" implies that the electrodes of the detection circuit are either galvanically insulated from the vehicle chassis and its electrical system, or are connected to the chassis and electrical system with such a high impedance, for example in the order of 50 kΩ, that the measured capacitance is to all intent and purpose unaffected by external factors.

The detection system according to the invention functions in the following manner. When the seat 10 is empty, relatively low capacitance is present between the electrodes 14 and 15 in the seat. Similarly, if a rear facing child seat is mounted on the seat 10, because the bulk of the child seat is not in the immediate vicinity of the electrodes, low capacitance prevails. Should, however, the seat 10 instead be occupied by a passenger who adopts a conventional sitting position, both the leg region and the back region of the passenger's body will lie immediately adjacent the electrodes. This will cause a substantial increase in the capacitance between the electrodes 14 and 15. The detection circuit 18 may then be used to detect this increase in capacitance to thereby produce an arming signal to the airbag sensor 34.

In order to illustrate the advantages of the present invention over hitherto proposed systems, the following comparison has been made between the system according to the present invention in which the electrodes are substantially insulated from the chassis of the vehicle and the system corresponding to that illustrated in FIGS. 1 and 2.

|  | PRIOR ART SYSTEM | PRESENT SYSTEM |
| --- | --- | --- |
|  | (units of frequency) | |
| Empty seat: | 128 | 128 |
| Small occupant (65 kg): | 86 | 94 |
| Large occupant (80 kg): | 82 | 93 |
| Driver's hand placed on seat: | 101 | 122 |

The value 128 implies that the passenger seat is empty. When a larger passenger occupies the seat, a lower value is obtained. The threshold value, i.e. the value at which the detection circuit detects that a passenger is present, can in the above example be set at 105. Thus, for any value below that figure, an arming signal is sent to the airbag sensor. In the prior art system, should the driver place his hand on the passenger seat, the detection circuit registers a value of 101, i.e. the circuit responds as though a passenger is sitting in a conventional position on the seat. This danger is eliminated using the present invention.

A further advantage with the present invention is that if the seat occupant is leaning forward, the capacitance between the electrodes 14 and 15 reduces since the occupant's back moves away from the electrode 15 in the backrest of the seat 10. By appropriately selecting the threshold value of the detection circuit, should the occupant lean forward to such an extent that deployment of the airbag could inflict serious injury, such deployment can be suppressed. By providing a plurality of first and second electrodes, movement of various parts of the occupant can be detected.

Although the present invention has been described in connection with providing an arming signal to a vehicle airbag sensor, it is to be understood that the above-disclosed method and system for detection of a seat occupant could also be used for example to activate a fasten-seatbelt warning lamp, to turn off the air conditioning system on the passenger side when the passenger seat is empty, etc.

Accordingly, the present invention is not restricted to the embodiments described above and illustrated in the drawings, but may instead be varied within the scope of the appended claims.

I claim:

1. A method for detecting the presence of an occupant on a vehicle seat, said method comprising:

providing said vehicle seat with a first electrode;

providing a detection circuit comprising said first electrode and a second electrode, said first electrode and said second electrode defining a capacitor having a capacitance dependent on a dielectric between said electrodes, said second electrode being placed with respect to said first electrode so that at least a portion of said occupant becomes at least a portion of said dielectric, thereby influencing the capacitance between the electrodes when said occupant occupies said seat;

using said detection circuit to determine the capacitance between said first and second electrodes;

comparing said capacitance with a predetermined value, and insulating said electrodes of said detection circuit from the chassis of the vehicle and its electrical system at least when said detection circuit is in an active condition.

2. The method as claimed in claim 1, further comprising providing an oscillator in said detection circuit to generate a frequency dependent on said capacitance between said first and second electrodes.

3. The method as claimed in claim 2, further comprising determining the magnitude of said generated frequency, comparing said magnitude with a predetermined value and providing an arming signal to an actuator of an airbag if said generated frequency lies below said predetermined value.

4. A system for detecting the presence of an occupant on a vehicle seat, said system comprising a vehicle seat provided with a first electrode, a detection circuit comprising said first electrode and a second electrode, said first electrode and said second electrode defining a capacitor having capacitance dependent on a dielectric between said electrodes, said second electrode being placed with respect to said first electrode so that at least a portion of said occupant becomes at least a portion of said dielectric, thereby influencing the capacitance between the electrodes when said occupant occupies said seat, said detection circuit detecting the capacitance between said first and second electrodes, wherein said electrodes of said detection circuit are insulated from the chassis of the vehicle and its electrical system at least when said detection circuit is in an active condition.

5. The system as claimed in claim 4, wherein said second electrode is located on or in the vehicle seat.

6. The system as claimed in claim 5, wherein said first and second electrodes constitute heating elements for the seat, which heating elements are supplied with current from said vehicle electrical system.

7. The system as claimed in claim 6, wherein means are provided to disconnect said heating elements from the vehicle electrical system when it is desired to detect the presence of said occupant.

8. The system as claimed in claim 5 or 7, wherein a current supply capacitor is provided in said detection circuit, which capacitor is charged when said detection circuit is connected to the electrical system of the vehicle and which discharges when said detection circuit is activated to detect the presence of said occupant.

9. The system as claimed in claim 5 or 6, wherein said first electrode comprises a plurality of electrode elements.

10. The system as claimed in claim 8, wherein said first electrode comprises a plurality of electrode elements.

11. The system as claimed in claim 4, wherein said first electrode is located in the seat cushion and said second electrode is located in the backrest of the seat.

12. The system as claimed in claim 10, wherein said first electrode is located in the seat cushion and said second electrode is located in the back rest of the seat.

13. The system as claimed in claims 5 or 6, wherein said second electrode comprises a plurality of electrode elements.

14. Read this system as claimed in claim 8, wherein said second electrode comprises a plurality of electrode elements.

15. A system for detecting the presence of an occupant on a vehicle seat, said system comprising a vehicle seat provided with a first electrode, a detection circuit comprising said first electrode and a second electrode, said first electrode and said second electrode defining a capacitor having capacitance, said second electrode being placed with respect to said first electrode so that at least a portion of said occupant influences the capacitance between the electrodes when said occupant occupies said seat, said detection circuit detecting the capacitance between said first and second electrodes, wherein said electrodes of said detection circuit are insulated from the chassis of the vehicle and its electrical system at least when said detection circuit is in an active condition, wherein said first electrode is located in the seat cushion and said second electrode is located in the backrest of the seat.

* * * * *